US007458148B2

(12) United States Patent
Matsumura

(10) Patent No.: US 7,458,148 B2

(45) Date of Patent: Dec. 2, 2008

(54) JOINT CONNECTOR AND METHOD ASSEMBLING THE SAME

(75) Inventor: Kaoru Matsumura, Makinohara (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 11/319,500

(22) Filed: Dec. 29, 2005

(65) Prior Publication Data

US 2006/0178023 A1 Aug. 10, 2006

(30) Foreign Application Priority Data

Feb. 7, 2005 (JP) .......................... P2005-030631

(51) Int. Cl.
*H05K 3/30* (2006.01)

(52) U.S. Cl. ....................................... 29/837; 439/76.1

(58) Field of Classification Search ................. 439/721, 439/723, 724, 76.1, 76.2; 29/837
See application file for complete search history.

(56) References Cited

U.S. PATENT DOCUMENTS 6,305,949 B1 * 10/2001 Okuyama et al. ............. 439/75
2005/0142905 A1 * 6/2005 Maejima et al. ............ 439/76.2

FOREIGN PATENT DOCUMENTS

JP 08-315932 A 11/1996
JP 11-178160 A 7/1999
JP 2004-229335 A 8/2004
JP 2005-160235 A 6/2005

OTHER PUBLICATIONS

Chinese Office Action dated Mar. 14, 2008.

* cited by examiner

*Primary Examiner*—Ross N Gushi
(74) *Attorney, Agent, or Firm*—Sughrue Mion, PLLC

(57) ABSTRACT

A joint connector includes a plurality of connection terminals, each of the connection terminals including a contact portion, a housing fixing portion and a press-fitting portion, a connector housing that includes a plurality of terminal fixing portions for fixing the corresponding housing fixing portions of the connection terminals, and a board that includes a plurality of through holes in which the corresponding press-fitting portions of the connection terminals are press-fitted respectively so as to electrically connect the connection terminals. The board is disposed in contact with the terminal fixing portion of the connector housing.

3 Claims, 10 Drawing Sheets

JOINT CONNECTOR AND METHOD ASSEMBLING THE SAME

BACKGROUND OF THE INVENTION

This invention relates to a joint connector for connecting, for example, a plurality of connection terminals, provided within a mating connector housing, together. This invention also relates to a method of assembling the joint connector.

A joint connector has been used for obtaining a plurality of branch lines from a single main line in an electric system, for example, of an automobile or the like, and a technique as disclosed in JP-A-2004-229335 (Pages 4 to 5, FIGS. 2 to 4) is known. In FIG. 9, the joint connector 101, disclosed in JP-A-2004-229335, includes a connector housing 102, a plurality of connection terminals 103, a board 104, and a cover 105.

A terminal fixing portion 106 for fixing the plurality of connection terminals 103 is formed at the connector housing 102. This terminal fixing portion 106 is formed within the connector housing 102, and is disposed intermediate front and rear sides thereof. The terminal fixing portion 106 is so formed that it divides the interior of the connector housing 102 into two (front and rear) spaces. The terminal fixing portion 106 has a plurality of through holes 107 (see FIG. 10) into which the connection terminals 103 can be press-fitted for fixing purposes. The board 104 can be put on an rear end 108 of the connector housing 102, and can be fixed thereto.

In FIGS. 9 and 10, the connection terminal 103 has a pin-like shape as shown in these Figures, and includes a connector-side contact portion 109, a housing fixing portion 110 extending from the connector-side contact portion 109, and a press-fit portion 111 extending from the housing fixing portion 110. The connector-side contact portion 109 projects into a fitting space 112 of the connector housing 102, and can be electrically connected to a mating connector. The housing fixing portion 110 is press-fitted into the terminal fixing portion 106. The press-fit portion 111 is electrically connected to the board 104.

Electrically-conductive pathways 113 are formed on front and back surfaces of the board 104. The board 104 has through holes 114 formed through the front and back surfaces thereof. An electrically-conducting portion 115 is formed at the through hole 114, and electrically connects the electrically-conductive pathways 113, formed respectively on the front and back surfaces, together. The cover 105 can be fitted on the rear end portion (including the rear end 108) of the connector housing 102 to covers the board 104.

In the above construction, the joint connector 101 is assembled by effecting three steps sequentially, that is, the first step of fixing the board 104 to the rear end 108 of the connector housing 102, the second step of press-fitting the connection terminals 103 into the connector housing 102 and the board 104 to electrically connect the connection terminals 103 to the board 104, and the third step of fitting cover 105 on the connector housing 102.

Here, the above second step will be described in more detail. The connection terminals 103 are inserted from the connector fitting space (112) side of the connector housing 102. At this time, the housing fixing portion 110 of the connection terminal 103 is press-fitted into the through hole 107 in the terminal fixing portion 106, and is fixed thereto, and the press-fit portion 111 of the connection terminal 103, projecting from the terminal fixing portion 106, is press-fitted into the conducting portion 115 in the board 104, and is electrically connected thereto.

In the above related technique, a space 116 is formed between the terminal fixing portion 106 and the board 104. Therefore, in case a plating film on the press-fit portion 111 of the connection terminal 103, projecting from the terminal fixing portion 106, is shaved when this press-fit portion 111 is inserted into the conducting portion 115 to be electrically connected thereto, there is a fear that shavings of the plating film move to some other contact through the space 116. The above related technique has a problem that an electrical leak occurs.

And besides, in the above related technique, a space 117 is formed between the board 104 and an inner bottom surface of the cover 105. Therefore, when electrically-conductive dirt or the like resides in the space 117, there encountered a problem that an electrical leak occurs.

SUMMARY OF THE INVENTION

This invention has been made in view of the above circumstances, and an object of the invention is to provide a joint connector capable of preventing an electrical leak. Another object is to provide a method of assembling such a joint connector.

The above problems have been solved by a joint connector, comprising a plurality of connection terminals each including a connector-side contact portion, a housing fixing portion and a press-fit portion; a connector housing including a terminal fixing portion which engages the housing fixing portions to fix the connection terminals; and a board having a plurality of through holes, wherein the press-fit portions are press-fitted respectively in the through holes so as to electrically connect the desired connection terminals together; the board is disposed in contact with the terminal fixing portion.

In the invention having the above feature, there is provided the structure in which the board is held in contact with the terminal fixing portion of the connector housing. The board is thus held in contact with the terminal fixing portion, and this prevents the formation of a space in which shavings of plating films, electrically-conductive dirt and others move. For example, the terminal fixing portion is formed into an increased thickness so that the board can be held in contact with the terminal fixing portion.

Further, advantageously, there can be provided the joint connector in which a leak is prevented by holding the board in contact with the terminal fixing portion of the connector housing.

Preferably, there is provided a cover fitted to the connector housing, and the cover is disposed in contact with the board, and a plurality of recesses are formed in a board contact surface of the cover, and end portions of the press-fit portions, projecting from the board, are received in the recesses, respectively.

In the invention having the above features, there is provided the structure in which the board contact surface is formed on the cover, and the board is held in contact with this board contact surface. Also, there is provided the structure in which the end portions of the press-fit portions are received respectively in the recesses formed in the cover. The cover is thus held with the board in such a manner that the end portions of the press-fit portions are received respectively in the recesses, and this prevents the formation of a space in which shavings of plating films, electrically-conductive dirt and others move.

Further, advantageously, there can be provided the joint connector in which the leak prevention effect is enhanced.

The above problems have been solved by a joint connector-assembling method, includes the steps of inserting a plurality of connection terminals, each including a connector-side contact portion, a housing fixing portion and a press-fit portion, into a terminal receiving jig in such a manner that the housing fixing portions and the press-fit portions project from the terminal receiving jig; fitting a connector housing, having a terminal fixing portion, on the plurality of connection terminals, and bringing the terminal fixing portion into abutting engagement with the housing fixing portions; setting a board, having a plurality of through holes, in a board receiving portion of the connector housing so as to bring the through holes into abutting engagement with the press-fit portions, respectively; and a load is applied to the board to bring the board into contact with the terminal fixing portion so as to bring the terminal fixing portion into a press-fitted condition relative to the housing fixing portions and also to bring the through holes into a press-fitted condition relative to the press-fit portions, respectively.

In the invention having the above features, the operation for bringing the board into contact with the terminal fixing portion of the connector housing, the operation for bringing the terminal fixing portion into a press-fitted condition relative to the housing fixing portions, and the operation for bringing the through holes into a press-fitted condition relative to the press-fit portions are carried out at a time. When these operations are not carried out at a time, there is a fear that shavings of plating films, electrically-conductive dirt and others move during a time interval between these operations. The invention can prevent the problems.

Further, advantageously, there can be provided the joint connector-assembling method which is efficient, and in which the board is held in contact with the terminal fixing portion of the connector housing.

Preferably, the method further includes the step of fitting a cover to the connector housing in such a manner that a board contact surface of the cover is held in contact with the board and that end portions of the press-fit portions, projecting from the board held in contact with the terminal fixing portion, are received respectively in a plurality of recesses formed in the cover.

In the invention having the above features, the board contact surface of the cover is brought into contact with the board simultaneously when the cover is fitted to the connector housing. At the same time, the end portions of the press-fit portions are received in the recesses, respectively. The fitting of the cover prevents the formation of a space in which shavings of plating films, electrically-conductive dirt and others move.

Further, advantageously, there can be provided the joint connector-assembling method in which the leak prevention effect is enhanced.

According to the present invention, there is also provided a joint connector, comprising:

a plurality of connection terminals, each of the connection terminals including a contact portion, a housing fixing portion and a press-fitting portion;

a connector housing that includes a plurality of terminal fixing portions for fixing the corresponding housing fixing portions of the connection terminals; and a board that includes a plurality of through holes in which the corresponding press-fitting portions of the connection terminals are press-fitted respectively so as to electrically connect the connection terminals, wherein the board is disposed in contact with the terminal fixing portion of the connector housing.

Preferably, the joint connector, further includes a cover that is fitted to the connector housing so as to cover the board. The cover has a contact face that contacts with the board. A plurality of recesses are formed in the contact face of the cover so as to respectively receive end portions of the connection terminals that are projected from the board.

Preferably, the connector housing has a first face in which the terminal fixing portions are provided. The board has a second face in which the through holes are provided, and the second face faces to the first face. The first face contacts with the second face.

According to the present invention, there is also provided a method of assembling a joint connector, comprising:

providing a plurality of connection terminals, each of the connection terminals including a contact portion, a housing fixing portion and a press-fitting portion;

providing a connector housing that includes a plurality of terminal fixing portions;

providing a board that includes a plurality of through holes, inserting the connection terminals into a terminal receiving jig so that the housing fixing portions and the press-fitting portions are projected from the terminal receiving jig;

fitting the connector housing on the connection terminals so as to fix the terminal fixing portions to the housing fixing portions;

setting the board on the connector housing so as to insert the press-fitting portions into the through holes; and pressing the board so as to contact with the terminal fixing portions of the connector housing so that the housing fixing portions are press-fitted into the terminal fixing portions, and the press-fitting portions are press-fitted into the through holes respectively.

Preferably, the method further includes:

providing a cover that includes a contact face and a plurality of recesses formed in the contact face, the recesses receiving end portions of the connection terminals that are projected from the board after the pressing process is carried out; and fitting the cover to the connector housing so as to cover the board so that the contact face contacts with the board.

Preferably, the connector housing has a first face in which the terminal fixing portions are provided. The board has a second face in which the through holes are provided, and the second face faces to the first face. The first face contacts with the second face in the pressing process.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE PREFERRED EMBODIMENTS

The present invention will now be described with reference to the drawings.

Figure 1:
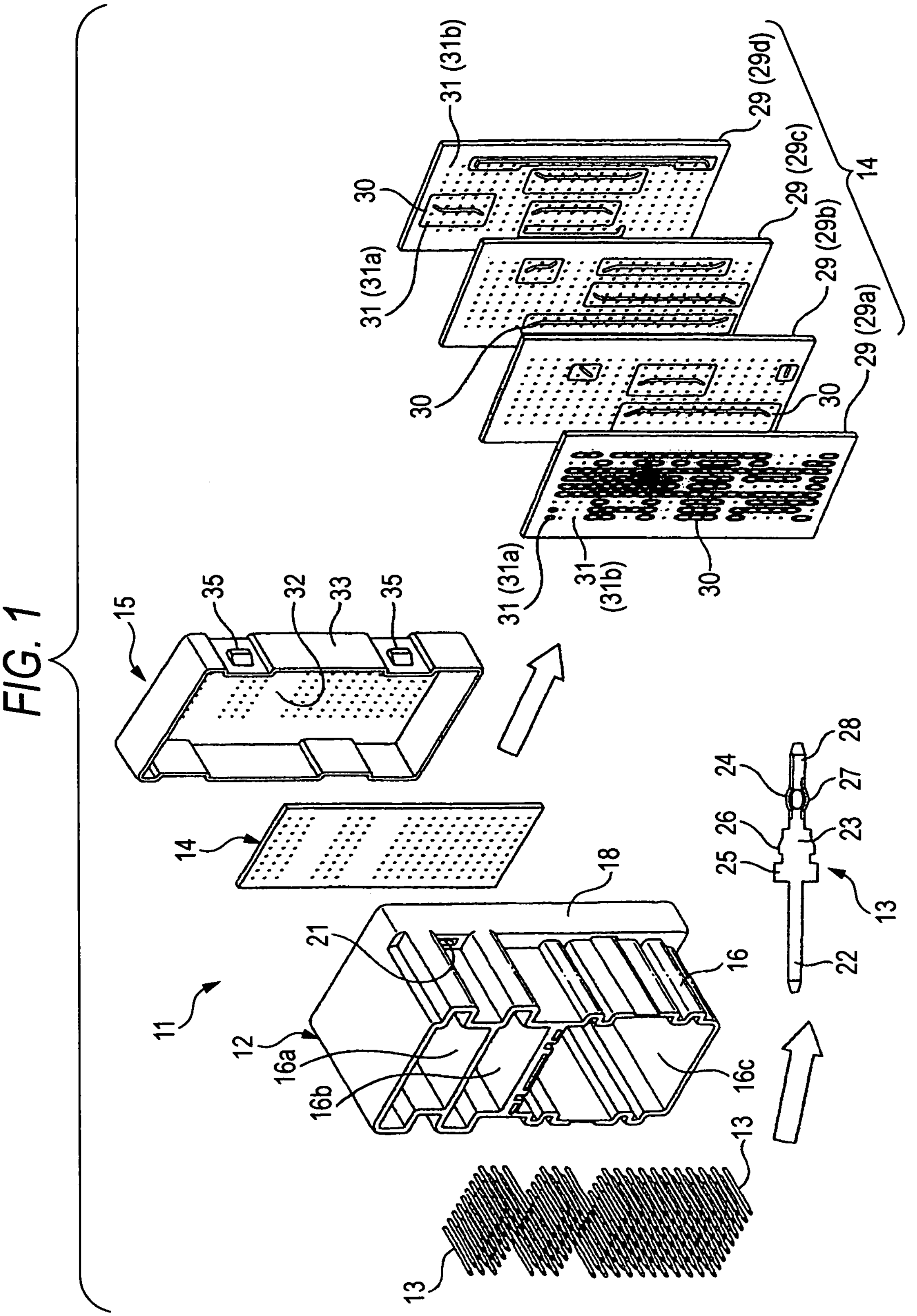
FIG. 1 is an exploded, perspective view of one preferred embodiment of a joint connector of the invention.
Figure 2:
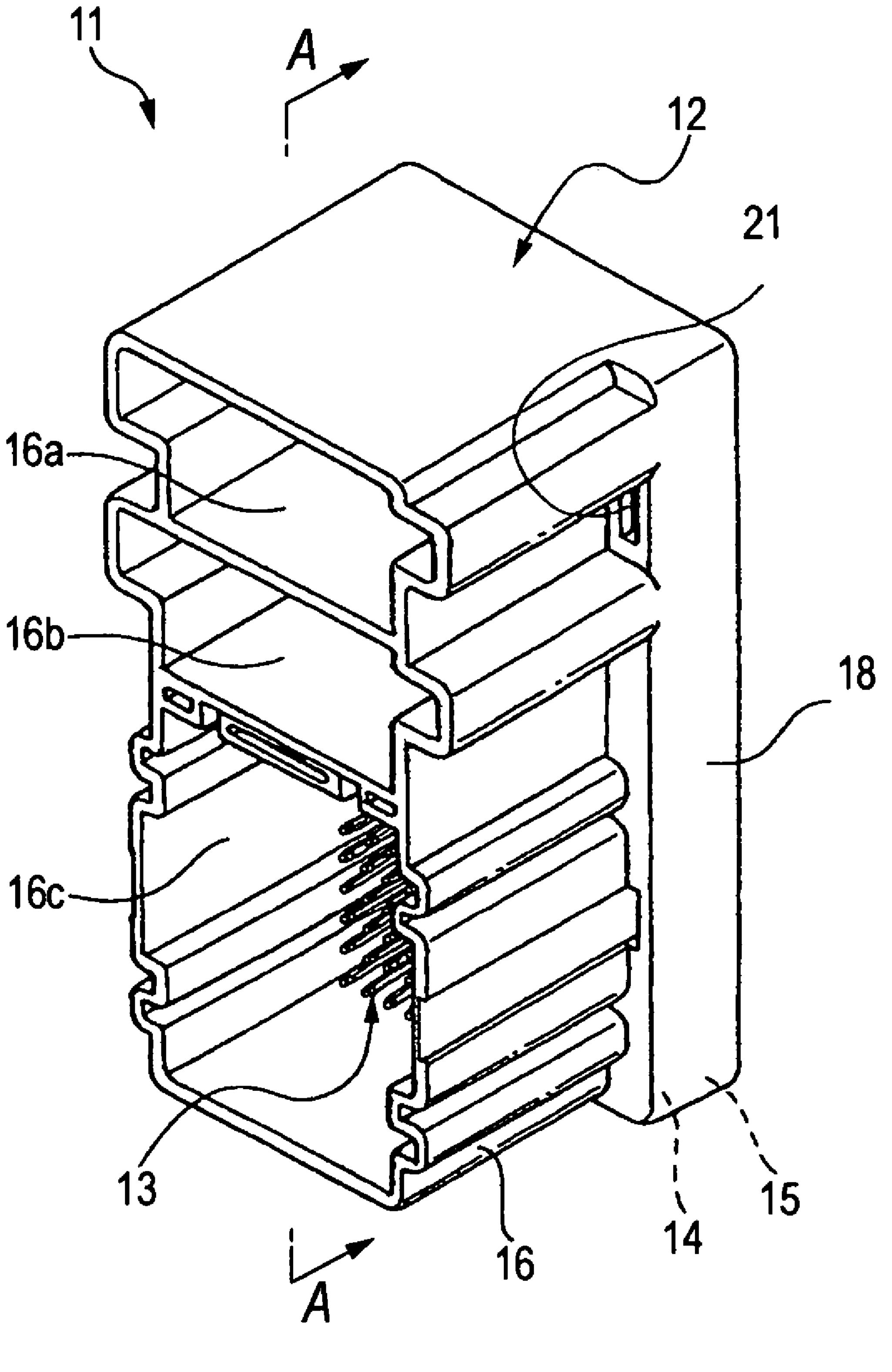
FIG. 2 is a perspective view of the joint connector.
Figure 3:
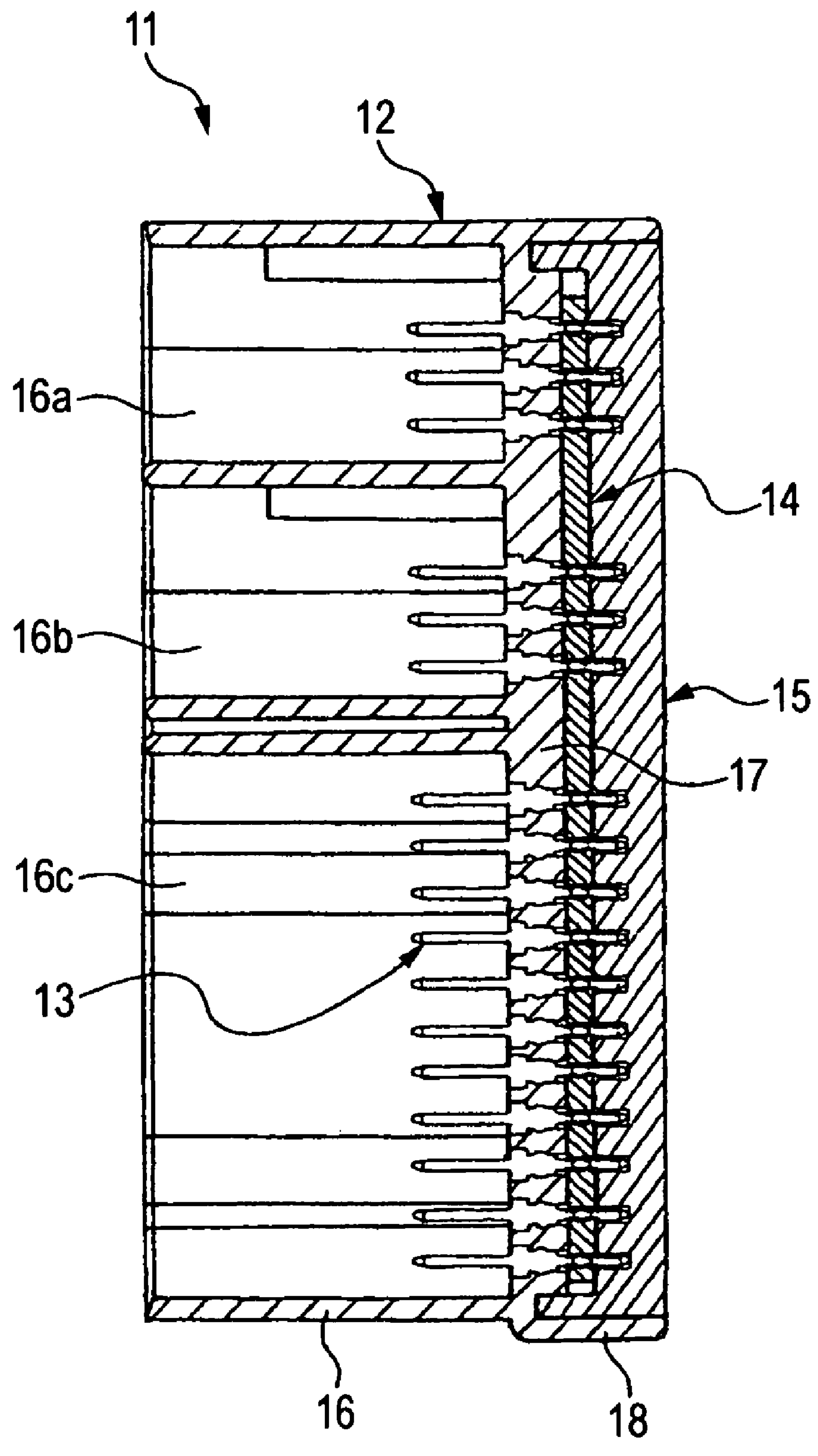
FIG. 3 is a cross-sectional view taken along the line A-A of FIG. 2.
Figure 4:
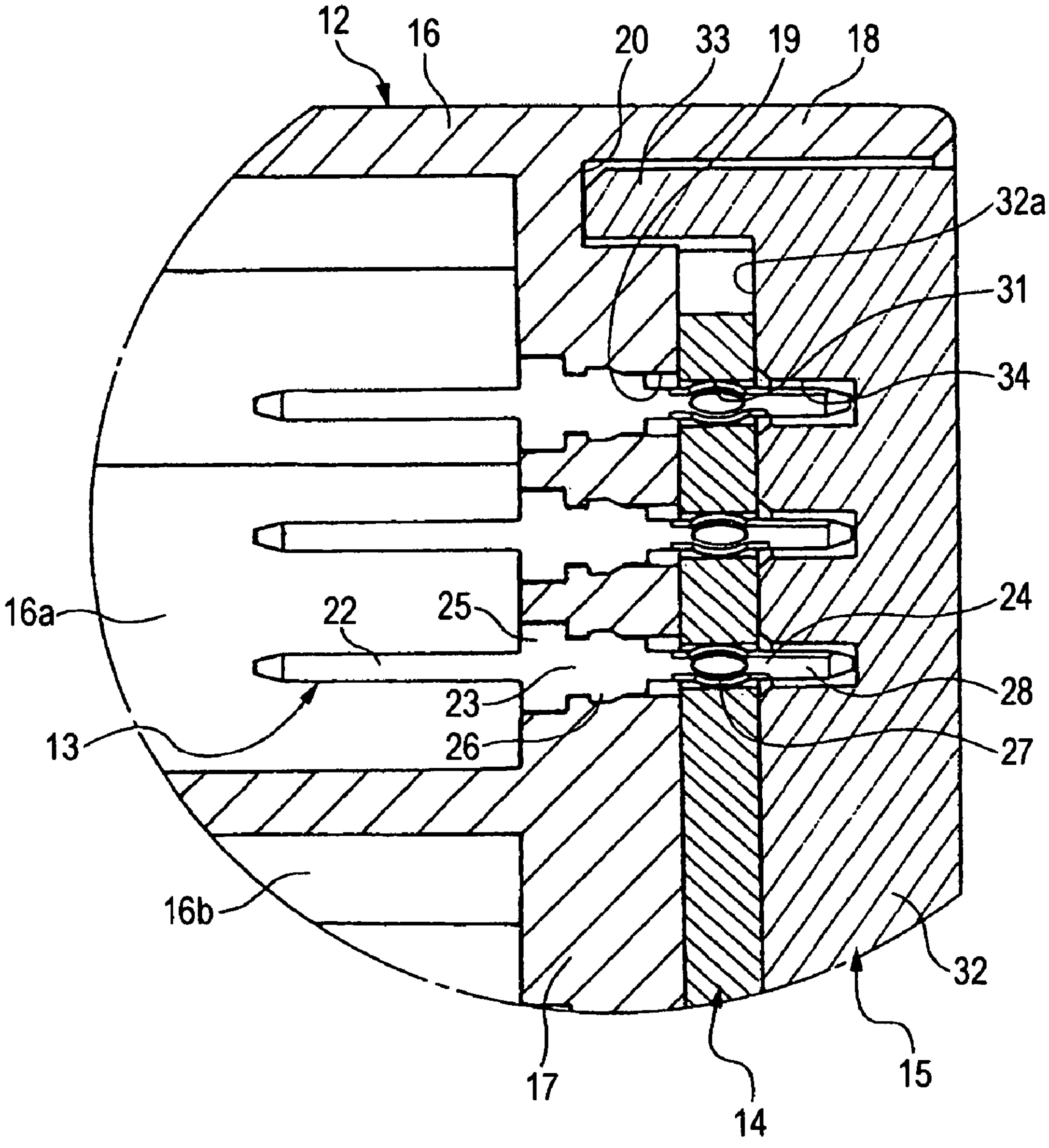
FIG. 4 is an enlarged cross-sectional view of an important portion of FIG. 3.

FIG. 1 is an exploded, perspective view of one preferred embodiment of a joint connector of the invention. FIG. 2 is a perspective view of the joint connector, FIG. 3 is a cross-sectional view taken along the line A-A of FIG. 2, and FIG. 4 is an enlarged cross-sectional view of an important portion of FIG. 3.

In FIGS. 1 to 4, reference numeral 11 denotes the joint connector of the invention. The joint connector 11 of the invention includes a connector housing 12, a plurality of connection terminals 13 fixed to the connector housing 12, a multi-layer board (board) 14 in which the connection terminals 13 are inserted, and a cover 15 fitted to a rear surface of the connector housing 12. The joint connector 11 of the invention is characterized by the structure of achieving a leak prevention effect and also by a method of assembling this joint connector 11. First, various constituent members will be described in detail.

The connector housing 12 is molded of an insulative synthetic resin. A fitting portion 16 for fittingly receiving connector housings of a plurality of mating connectors (not shown) is formed in a front side of the connector housing 12. A terminal fixing portion 17 for the plurality of connection terminals 13 is formed within the connector housing 12, and is disposed intermediate the front and rear sides thereof. A board receiving portion 18 for receiving the multi-layer board 14 is formed at the rear side of the connector housing 12, and the cover 15 is fitted in this board receiving portion 18.

The fitting portion 16 is formed into such a shape that it can guide the connector housings of the inserted mating connectors, and also can retain these connector housings. The fitting portion 16 has three fitting portions (first to third fitting portions 16*a* to 16*c*) although the fitting portion 16 is not particularly limited to such a structure.

The terminal fitting portion 17 serves also as an inner end wall of the fitting portion 16 formed at an inner end thereof. A plurality of terminal press-fitting through holes 19 are formed through the terminal fixing portion 17. Each of the through holes 19 is formed through the terminal fixing portion 17 in such a manner that it is disposed perpendicular to front and rear surfaces of the terminal fixing portion 17. The through hole 19 is formed into a stepped configuration. The through hole 19 is so formed that the connection terminal 13, inserted thereinto from the fitting portion (16) side (that is, from the front side of the terminal fixing portion 17), can be stopped in a predetermined position. In this embodiment, the through holes 19 are formed in the following number (This is merely one example). Namely, the through holes 19, formed in each of those portions of the terminal fixing portion 17 corresponding respectively to the first and second fitting portions 16*a* and 16*b*, are 3×9 in number, and the through holes 19, formed in that portion of the terminal fixing portion 17 corresponding to the third fitting portion 16*c*, are 11×9 in number.

The board receiving portion 18 is formed to provide the open rear side of the connector housing 12. The depth, length and breadth of the board receiving portion 18 are determined, taking the thicknesses of the multi-layer board 14 and cover 15 into consideration. A recess 20 for receiving a front end portion of the cover 15 is formed in the board receiving portion 18, and also retaining portions 21 for retaining engagement with retaining projections 35 (described later) formed on the cover 15 are formed at the board receiving portion 18.

Each of the connection terminals 13 is made of an electrically-conductive metallic material. The connection terminal 13 includes a connector-side contact portion 22, a housing fixing portion 23, and a press-fit portion 24, and this connection terminal 13 has, for example, a generally pin-shape as shown in the drawings. The connection terminal 13 may be called "a press-fit terminal" since it has the press-fit portion 24.

When the connection terminal 13 is fixed to the connector housing 12, the connector-side contact portion 22 projects into the fitting portion 16 so as to contact a connection terminal of the mating connector. In this embodiment, although the connector-side contact portion 22 is formed into a pin-shape, it is not limited to this shape, and can be formed into a tab-shape.

The housing fixing portion 23 is formed on an intermediate portion of the connection terminal 13. When the connection terminal 13 is fixed to the connector housing 12, the housing fixing portion 23 is press-fitted in the through hole 19 in the terminal fixing portion 17. The housing fixing portion 23 includes an abutment portion 25 for abutting against the step portion of the through hole 19, and a withdrawal prevention portion 26 for biting into an inner surface of the through hole 19. The abutment portion 25 is formed close to the connector-side contact portion 22, while the withdrawal prevention portion 26 is formed close to the press-fit portion 24.

When the connection terminal 13 is fixed to the connector housing 12, the press-fit portion 24 projects toward the board receiving portion 18, and is inserted into the multi-layer board 14. The press-fit portion 24 includes a resiliently-deformable body portion 27, for example, of an oval shape disposed close to the housing fixing portion 23, and a pin-like guide portion 28 extending from the body portion 27 to a distal end of this press-fit portion 24.

The multi-layer board 14 includes a plurality of boards 29 stacked together, and more specifically is formed by four boards 29*a* to 29*d* although the number of the boards is not particularly limited to four. The boards 29 are fixed to one another by suitable fixing means employing an adhesive or fixing members. Circuits 30 of desired patterns are formed on the boards 29 by printing. In this embodiment, the plurality of circuits 30 are formed by printing on that surface (front surface) of the board facing that side from which the connection terminals 13 are inserted. Each board 29 is formed into a construction similar to that of a known printed circuit board.

A plurality of through holes 31 are formed through each board 29 of the multi-layer board 14. The press-fit portion 24 of the connection terminal 13 is inserted into the through hole 31, and the plurality of through holes 31 are formed and arranged according to the number and arrangement of the connection terminals 13. The through hole 31 is formed into such a size that the body portion 27 of the press-fit portion 24, when inserted into the through hole 31, can be resiliently deformed.

The through holes 31 are classified into two types, that is, through holes 31*a* (each having a circuit connecting portion (not shown) for electrically connecting the body portion 27 to the circuit 30) and through holes 31*b* each in the form of a mere through hole not provided with the circuit connecting portion (not shown). By suitably using the through holes 31*a*, desired connection terminals 13 can be electrically connected together. Each of the through holes 31*a* is formed to extend through the corresponding circuit 30 since it has the circuit connecting portion (not shown). On the other hand, the through holes 31*b* are formed to extend through those regions of the board 29 where no circuit 30 exists.

Instead of using the multi-layer board 14, a single board can be used. Although not particularly shown in the drawings, such a single board is one printed circuit board, and is larger in thickness than the board 29, and has circuits of desired patterns formed on its front and back surfaces thereof. The single board is useful in the case where a smaller number of circuits than the number of the circuits on the multi-layer board 14 are used. Although not particularly shown in the drawings, the multi-layer board 14, received in the board receiving portion 18, is fixed to the connector housing by screws (This fixing means is merely one example).

The cover 15 is inserted into the board receiving portion 18 of the connector housing 12, and is retained therein. The cover 15 includes a bottom portion 32, and a side portion 33, and is formed into a shallow box-shape. The bottom portion 32 of the cover 15 is formed into a flat plate-like shape, and its inner surface serves as a board contact surface 32*a* for contact with the multi-layer board 14 (It is preferred to provide the structure in which the board contact surface 32*a* contacts the multi-layer board 14 although the invention is not particularly limited to this structure.). A plurality of recesses 34 are formed in the board contact surface 32*a*, and the distal end portions (end portions) of the press-fit portions 24, passing through the multi-layer board 14, can be inserted into the recesses 34, respectively. The recesses 34 are formed and arranged according to the number and arrangement of the connection terminals 13.

The plurality of retaining projections 35 for retaining engagement respectively with the retaining portions 21 of the connector housing 12 are formed on the side portion 33 of the cover 15. Each retaining projection 35 is formed into a claw-like shape. A tapering surface is formed on the retaining projection 35 so as to achieve the smooth retaining engagement.

The provision of the cover 15 is arbitrary, and in the case where this cover is included in the joint connector as in the invention, it is effective in protecting and holding the multi-layer board 14 and also in preventing a leak.

Next, the method of assembling the joint connector 11 of the invention will be described on the basis of the above construction the joint connector 11 of the invention is assembled broadly by effecting four steps sequentially. FIGS. 5 to 8 are views explanatory of these assembling steps, respectively.

Figure 5:
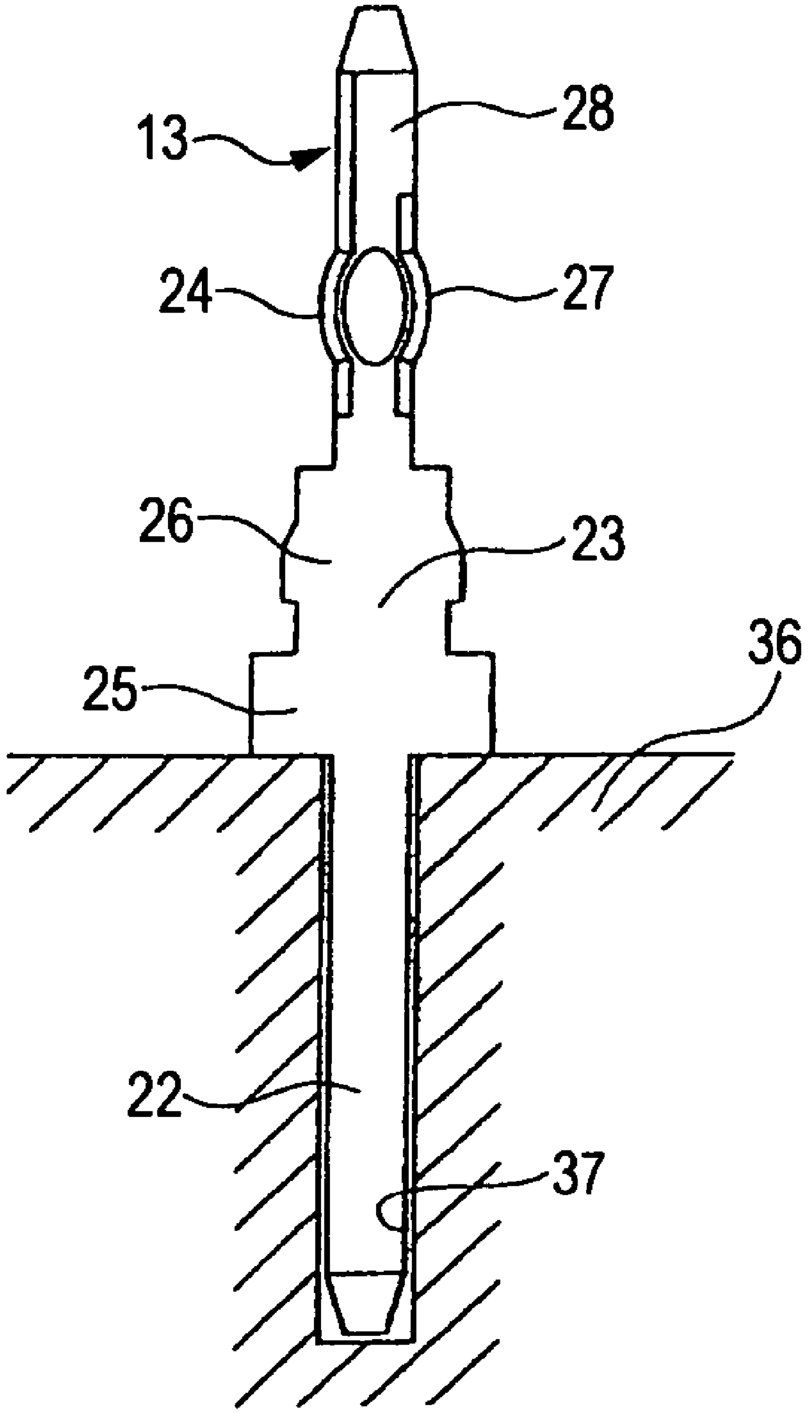
FIG. 5 is a view explanatory of a first step of a process of assembling the joint connector.

In the first step, first, a required number of connection terminals 13 are cut off from a reel (not shown). In this embodiment, nine (9) consecutive connection terminals 13 are cut off for forming each row (This is merely one example.). Then, the rows of connection terminals 13 thus cut are set one (one row) at a time on a terminal receiving jig 36. The setting of the connection terminals on the terminal receiving jig 36 is carried out by inserting the connector-side contact portions 22 of the connection terminals 13 respectively into insertion holes 37 in the terminal receiving jig 36. At this time, the connection terminal is inserted into the insertion hole 37, and is set on the jig in such a manner that the abutment portion 25 of the housing fixing portion 23 of the connection terminal 13 abuts against a peripheral edge portion of an opening of the insertion hole 37. When the setting of the connection terminals on the terminal receiving jig 36 is completed, the housing fixing portions 23 and press-fit portions 24 of the press-connecting terminals 13, as well as carriers (not shown) of the rows of connection terminals 13, project from the jig. Then, the carriers (not shown) of the rows of connection terminals 13 are collectively cut at a time, using a carrier cutting jig (not shown). A condition, shown in FIG. 5, is achieved when the above operations of the first step are completed.

Figure 6:
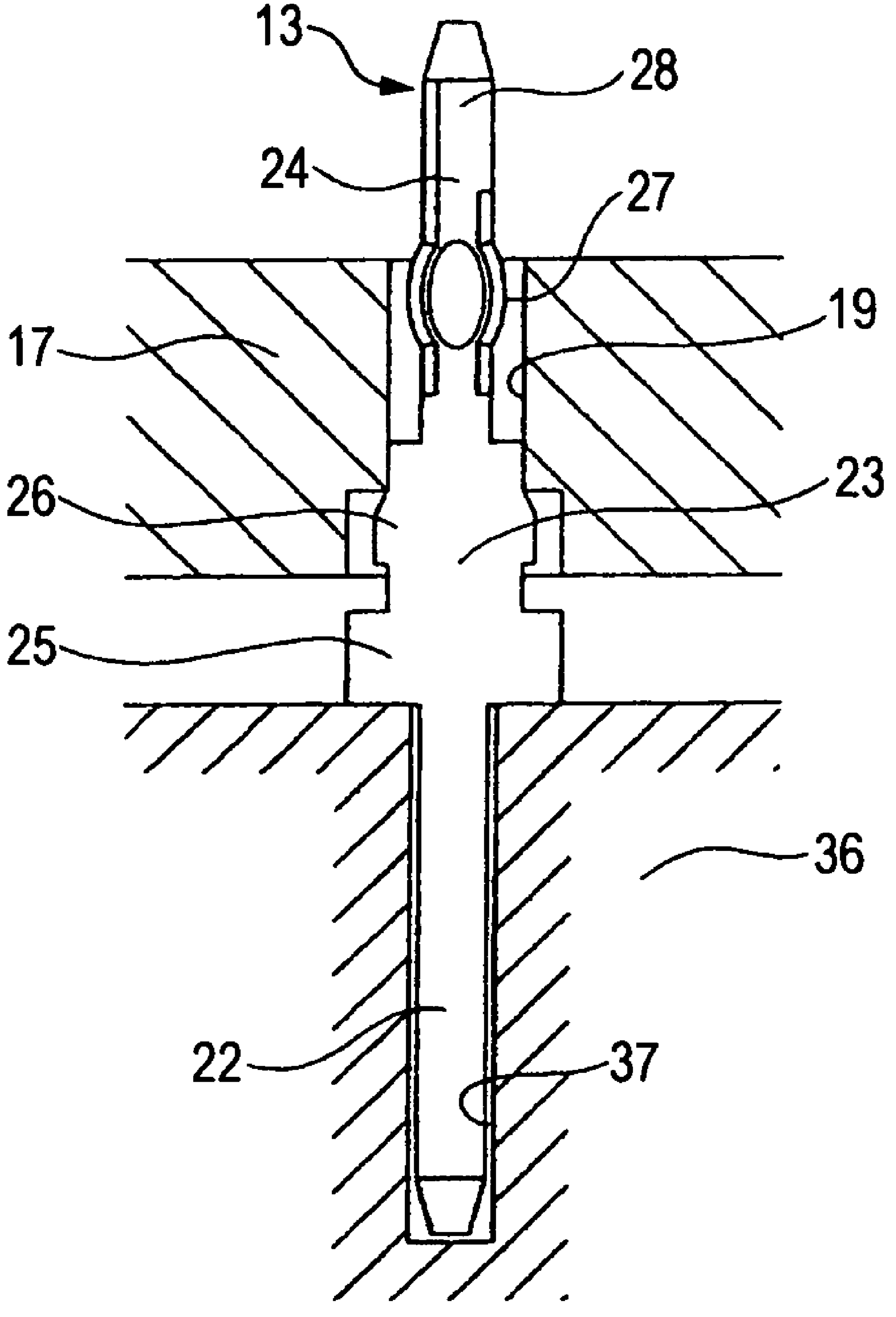
FIG. 6 is a view explanatory of a second step of the joint connector-assembling process.

In the second step, the connector housing 12 is fitted on the plurality of connection terminals 13 held on the terminal receiving jig 36, and the terminal fixing portion 17 of the connector housing 12 is brought into abutting engagement with the housing fixing portions 23 of the connection terminals 13. Each through hole 19 in the terminal fixing portion 17 has the stepped shape, and the step portion of the through hole 19 abuts against the withdrawal prevention portion 26 of the housing fixing portion 23. In the second step, a condition, shown in FIG. 6, is achieved. When the terminal fixing portion 17 abuts against the withdrawal prevention portions 26, this terminal fixing portion 17 is disposed spaced from the terminal receiving jig 36.

Figure 7:
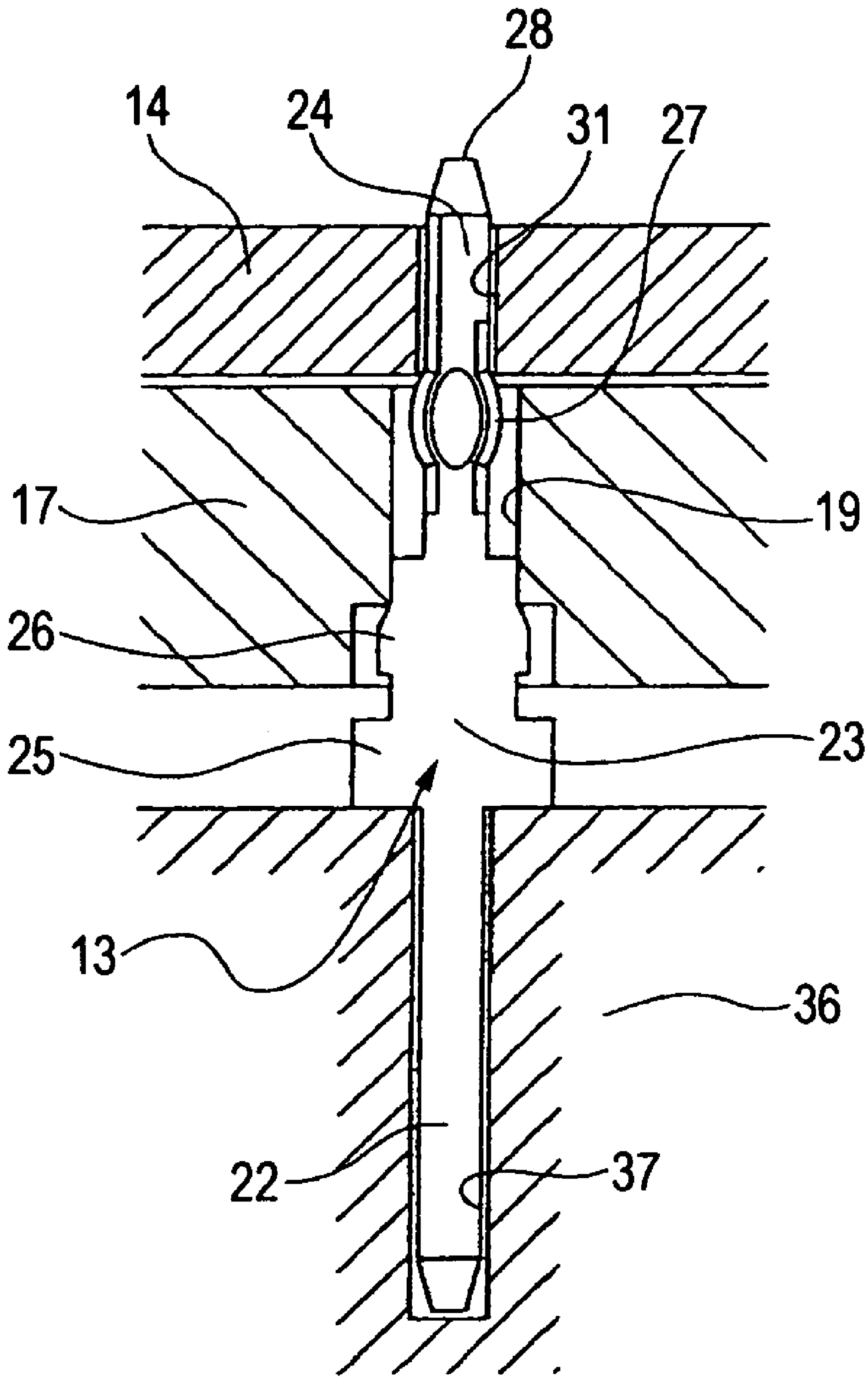
FIG. 7 is a view explanatory of a third step of the joint connector-assembling process.

In the third step, the multi-layer board 14 is set in the board receiving portion 18 of the connector housing 12, and the through holes 31 in the multi-layer board 14 are brought into abutting engagement with the press-fit portions 24 of the connection terminals 13, respectively. Each through hole 31 in the multi-layer board 14 abuts against the body portion 27 of the press-fit portion 24 projecting from the terminal fixing portion 17 of the connector housing 12. The guide portion 28 of the press-fit portion 24 passes through the multi-layer board 14, so that the distal end of this guide portion 28 projects from the multi-layer board 14. In the third step, a condition, shown in FIG. 7, is achieved. When the multi-layer board 14 abuts against the body portions 27 of the press-fit portions 24, this multi-layer board 14 is disposed slightly spaced from the terminal fixing portion 17.

Figure 8:
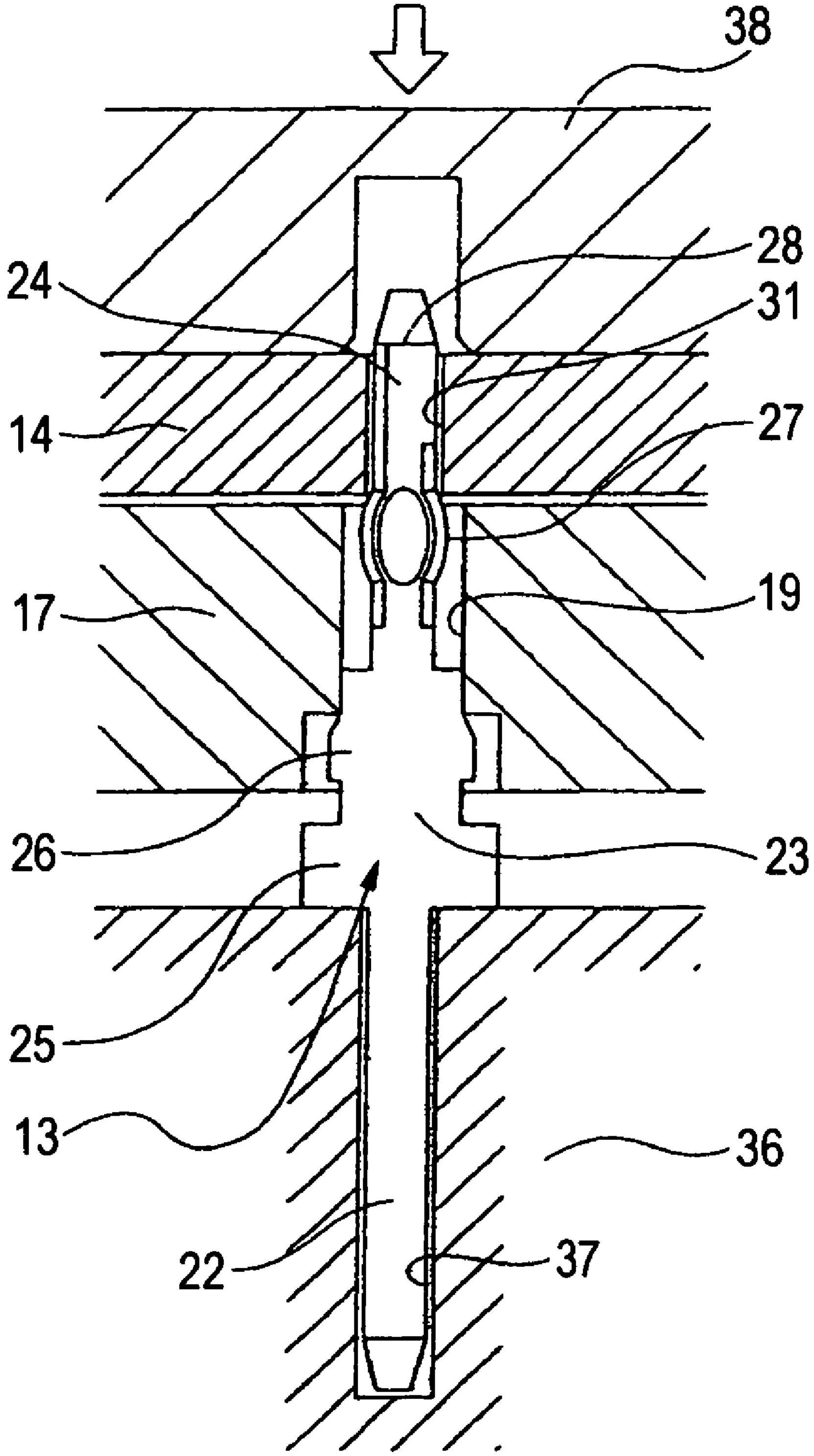
FIG. 8 is a view explanatory of a fourth step of the joint connector-assembling process.
Figure 9:
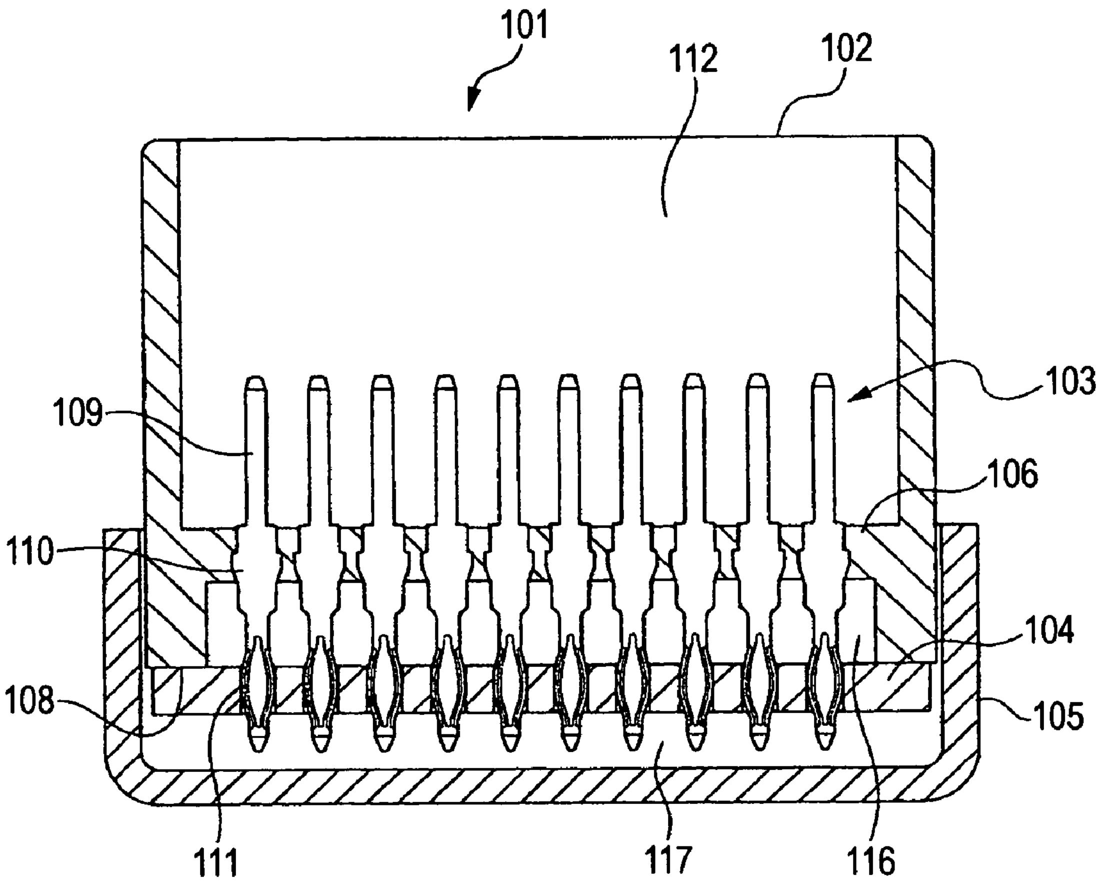
FIG. 9 is a cross-sectional view of a related joint connector.
Figure 10:
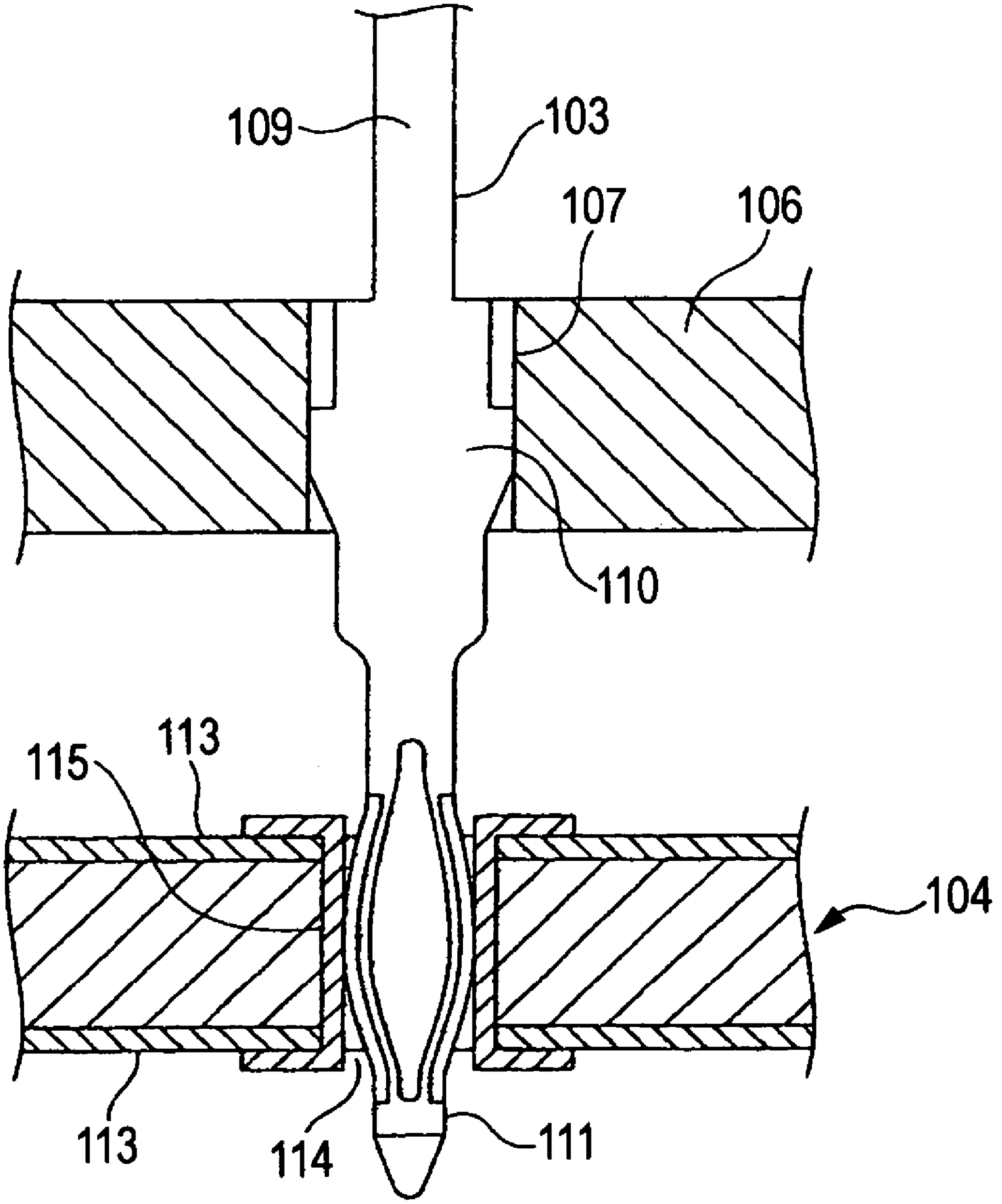
FIG. 10 is an enlarged cross-sectional view of an important portion of FIG. 9.

In the fourth step, the multi-layer board 14 is brought into contact with the terminal fixing portion 17, and at the same time the terminal fixing portion 17 is brought into a press-fitted condition relative to the housing fixing portions 23, and also the through holes 31 are brought into a press-fitted condition relative to the press-fit portions 24, respectively. In the fourth step, by the use of a terminal driving jig 38, a load is applied to the multi-layer board 14 to move the same in a direction toward the terminal fixing portion 17 as shown in FIG. 8. The multi-layer board 14 and the terminal fixing portion 17 are forced toward the terminal receiving jig 36 by the load applied from the terminal driving jig 38, and as a result the multi-layer board 14 is brought into intimate contact with the terminal fixing portion 17. At the same time, the terminal fixing portion 17 is press-fitted relative to the housing fixing portions 23, and also the through holes 31 are press-fitted relative to the press-fit portions 24, respectively. The plurality of connection terminals 13 are fixed to the terminal fixing portion 17, and also are collectively connected to the multi-layer board 14 at a time (The multi-layer board 14 is held in intimate contact with the terminal fixing portion 17, and therefore even if a plating film on each connection terminal 13 is shaved, such shaving is prevented from moving to some other contact. The shavings of the plating films collect in the through holes 31 or the through holes 19.).

In the fourth step, after the operation for driving the connection terminals 13 by the use of the terminal driving jig 38 is completed, the terminal driving jig 38 is removed, and the multi-layer board 14 is fixed to the terminal fixing portion 17 by the screws. Then, a moisture-proof coating is applied to the distal end portions of the press-fit portions 24, slightly projecting from the multi-layer board 14, and the surface of this board. Finally, the cover 15 is fitted to the rear surface of the connector housing 12. When the fitting of the cover 15 to the connector housing is completed, the distal end portions of the press-fit portions 24, slightly projecting from the multi-layer board 14, are received respectively in the recesses 34 in the cover 15, and the board contact surface 32*a* of the cover 15 is held in intimate contact with the multi-layer board 14 as shown in FIGS. 3 and 4 (Even if the plating film on each connection terminal is shaved, this shaving of the plating film collects in the through hole 31 or the recess 34.). Thus, the series of assembling steps are finished, so that the joint connector 11 of the invention is completed.

When the mating connectors are connected to the fitting portion 16 of the joint connector 11 of the invention, a plurality of branch lines are obtained from a single main line, for example, of a wire harness.

As described above with reference to FIGS. 1 to 8, there is provided the structure in which the multi-layer board 14 is held in intimate contact with the terminal fixing portion 17, and therefore even if a plating film on each connection terminal 13 is shaved, such shaving is prevented from moving to some other contact. Therefore, a leak can be prevented.

Various modifications can be made without departing from the subject matter of the present invention.

What is claimed is:

1. A method of assembling a joint connector, comprising:

providing a plurality of connection terminals, each of the connection terminals including a contact portion, a housing fixing portion and a press-fitting portion;

providing a connector housing that includes a plurality of terminal fixing portions;

providing a board that includes a plurality of through holes, inserting the connection terminals into a terminal receiving jig so that the housing fixing portions and the press-fitting portions are projected from the terminal receiving jig;

fitting the connector housing on the connection terminals so as to fix the terminal fixing portions to the housing fixing portions projecting from the terminal receiving jig;

setting the board on the connector housing so as to insert the press-fitting portions into the through holes; and pressing the board so as to contact with the terminal fixing portions of the connector housing so that the housing fixing portions are press-fitted into the terminal fixing portions, and the press-fitting portions are press-fitted into the through holes respectively.

2. The method according to claim 1, further comprising:

providing a cover that includes a contact face and a plurality of recesses formed in the contact face, the recesses receiving end portions of the connection terminals that are projected from the board after the pressing process is carried out;

fitting the cover to the connector housing so as to cover the board so that the contact face contacts with the board.

3. The method according to claim 1, wherein the connector housing has a first face in which the terminal fixing portions are provided;

wherein the board has a second face in which the through holes are provided, and the second face faces to the first face; and wherein the first face contacts with the second face in the pressing process.

* * * * *